United States Patent
Noh et al.

(10) Patent No.: US 6,483,770 B2
(45) Date of Patent: Nov. 19, 2002

(54) SYNCHRONOUS SEMICONDUCTOR MEMORY DEVICE AND METHOD FOR OPERATING SAME

(75) Inventors: Yong-Hwan Noh, Kwachon (KR); Kyo-Min Sohn, Seoul (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 09/849,289

(22) Filed: May 4, 2001

(65) Prior Publication Data

US 2002/0060946 A1 May 23, 2002

(30) Foreign Application Priority Data

Nov. 20, 2000 (KR) .......................................... 00-68967

(51) Int. Cl.$^7$ ................................................. G11C 8/00
(52) U.S. Cl. ..................................... 365/233; 365/233.5
(58) Field of Search ............................... 365/233, 233.5

(56) References Cited

U.S. PATENT DOCUMENTS 5,835,443 A * 11/1998 Fujita ........................ 365/233

FOREIGN PATENT DOCUMENTS

JP          0028542    *  2/1980  ........... G11C/11/34

OTHER PUBLICATIONS

Betty Prince, "Semiconductor Memories", 1983, wiley, 2$^{nd}$ edition, pp. 341–343.*

* cited by examiner

Primary Examiner—M. Tran
(74) Attorney, Agent, or Firm—F. Chau & Associates, LLP

(57) ABSTRACT

Disclosed is a semiconductor memory device comprising a pipeline structure having a sense amplifier responsive to a first enable signal; a data register responsive to a second enable signal for latching an output of said sense amplifier between said sense amplifier and a common data line; and a monitoring part to monitor said first and second enable signals and adapted to prevent overlapping between an enabling interval of said first enable signal and said second enable signal.

17 Claims, 12 Drawing Sheets

SYNCHRONOUS SEMICONDUCTOR MEMORY DEVICE AND METHOD FOR OPERATING SAME

BACKGROUND OF THE INVENTION

1. Field of the Invention

The present invention relates to a semiconductor integrated circuit, and more particularly to a synchronous semiconductor memory device and method for operating same.

2. Description of the Related Art

As electronic systems in the field of computers, communications, and other related industries get larger and more highly functional, such systems require semiconductor memory having ever greater storage capacity at higher speeds of operation. High-speed static random access memory devices play an important role as cache memory for computer and communication applications. Because data processors operate at an extremely high-speed, it is desirable to make the cache memory operate as fast as possible to improve performance of the system. In order to improve the data transmission rates of such memories, double data rate methods, pipeline burst methods, and the like have been utilized in the art.

FIGS. 1 and 2 show, respectively, a block diagram and timing diagram of a synchronous burst memory device in accordance with the prior art, as disclosed by Leach et al. in U.S. Pat. No. 5,923,615, issued Jul. 13, 1999. In order to provide a synchronous pipeline burst memory that can operate at high clock speeds without the addition of a pipeline stage, it has been constructed with address input buffer 22, address register 24, synchronous control circuit 26, data register 28, data output buffer 30 and asynchronous (non-synchronous) memory core 40. The address register 24 latches a burst address during a first cycle, and the latched burst address is sent to an input of the asynchronous memory core 40. The memory core comprises a plurality of memory cells 52. The output data from the asynchronous memory core 40 is not latched until a third cycle of a periodic clock signal. At this time, the third cycle is generated after a second cycle of the periodic clock signal, followed again by the first cycle thereof. Such burst operation cycle systems have the advantage of guaranteeing a sensing operation between the start of the activation of word lines to the differentiation of bit lines, which is not typical of pipeline systems in general.

Pipeline burst systems suffer a disadvantage in that the data output from the memory cells at the start of an activation timing of a latch signal provided at the synchronous control circuit 26 is not latched until the third cycle of the periodic clock signal, thereby limiting speed. As a result, the cycle time tCYC is no less than the time that it takes from transmission of an external clock signal to the latching of data at the data register. Thus, if the operation cycle time exceeds a critical time interval, there may develop errors in latching data and instability of the sensing operations.

In the field related to synchronous pipeline memory devices there have been various efforts to decrease the cycle time. Description will be made on a typical pipeline operation well known in the field.

FIG. 3 is a timing diagram for illustrating a read operation of a conventional 2-stage synchronous pipeline memory device. The read operation of the 2-stage synchronous pipeline memory device will be described with reference to FIG. 3. If an external address XADD is input at the first cycle T1 of an external clock signal XCLK, an address is decoded during the first cycle T1 to shift a row-selecting signal SWL and a column-selecting signal Yi to a memory cell array. The row- and column-selecting signals are enabled to select the corresponding memory cells. The charge stored at the selected memory cell is shared with the corresponding data lines SDL and /SDL (where "/x" indicates the complement of x). After the charge is shared with the corresponding data lines SDL, /SDL a block sense amplifier (BSA, or the first sense amplifier) operates in response to a sense amplifier enabling signal PSA1. The sense amplifier senses and amplifies the voltage difference between the data lines and provides the information as cell data that shows information stored about a memory cell selected at a common data line, the main data lines MDL, /MDL. The cell data is latched at the data register connected at the rear stage of the output buffer through a general output buffer connected to the main data lines MDL, /MDL. The data register shifts the latched cell data to an output driver in response to a secondary clock signal, Kdata, shifted from the second cycle of the external clock signal, XCLK. Finally, the cell data is driven by the output driver to output to an external data input /output terminal.

As a result, the cycle time tCYC is determined as the time that it takes an external clock signal to start shifting until data latches at the data register. The clock to data speed, tCD, is determined as the time that cell data latched at the data register goes through the output driver outside after activation of the secondary clock signal Kdata.

Because it takes quite long for cell data to latch to the data register in the 2-stage synchronous pipeline memory device, there may be limitations in making reductions in the cycle times. Therefore, a variety of techniques have been tried to shorten the time required for data to latch to the data register after shifting of an external clock signal.

One such technique relates to a 4(+)-stage pipelines (i. e., a pipeline having four or more stages) constructed with the addition of a data register between the sense amplifier and common data line on top of the structure of a pipeline having three or more stages. However, even if the 4(+)-stage pipeline as such can make a significant reduction in operation cycle time in comparison with the structure of a 2-stage pipeline, it is still difficult to reduce the cycle time, because there will be an overlapping interval in an extremely short cycle time when both the sense amplifier enabling signal and the second clock for controlling register are simultaneously enabled. During the overlapping terminal, data glitch may consequently bring about to result in an error in the read data.

Therefore, there is a need to more efficiently control the operation of such synchronous pipeline semiconductor memory devices having more than three stages.

SUMMARY OF THE INVENTION

Disclosed is a semiconductor memory device comprising a 4(+)-stage pipeline structure having a sense amplifier responsive to a first enable signal; a data register responsive to a second enable signal for latching an output of said sense amplifier between said sense amplifier and a common data line; and a monitoring part to monitor said first and second enable signals and adapted to prevent overlapping between an enabling interval of said first enable signal and said second enable signal.

In another aspect of the invention, the monitoring part includes a latch part constructed with logic elements.

In another aspect of the invention, the latch part is a NAND gate latch including two NAND gates.

In another aspect of the invention, the first disabling circuit is additionally connected to the monitoring part for disabling the first enable signal in response to sensing data that appears at data output terminals of the sense amplifier after the first enable signal is enabled.

In another aspect of the invention, the second disabling circuit is additionally connected to the monitoring part for disabling the second enable signal in response to output data that appears at data output terminals of the common data line after the second enable signal is enabled.

Disclosed is a synchronous pipeline semiconductor memory device, comprising a memory cell array constructed with a plurality of memory cells; a sense amplifier for sensing and amplifying cell data of a selected memory cell in response to the first enable signal shifted from the first clock cycle of an external clock; a first data register is connected between an output terminal of the sense amplifier and the common data line for outputting the output data of the sense amplifier to the common data line in response to the second enable signal shifted from the second clock cycle followed by the first clock cycle; a second data register for receiving output data of an output buffer is connected to the common data line and providing the output data to an output driver in response to the third enable signal shifted from the third clock cycle followed by the second clock cycle; and a monitoring part for monitoring the first and second enable signals and then respectively shifting the calibrated first and second enable signals to the sense amplifier and the first data register, to prevent overlapping between enabling intervals of the first and second enable signals when the first and second enable signals are respectively enabled.

In another aspect of the invention, the monitoring part includes a flip-flop circuit.

In another aspect of the invention, the flip-flop circuit is a NAND gate type of a flip-flop circuit constructed with two NAND gates.

In another aspect of the invention, the first disabling circuit is additionally connected to the monitoring part for disabling the first enable signal in response to sensing data that appears at the data output terminals of the sense amplifier after the first enable signal is enabled.

In another aspect of the invention, the second disabling circuit is additionally connected to the monitoring part for disabling the second enable signal in response to output data that appears at data output terminals of the common data line after the second enable signal is enabled.

Disclosed is a method for controlling a sense amplifier and a data register of a semiconductor memory device having the structure of operating the a 4(+)-stage pipeline constructed with an addition of a data register for latching an output of the sense amplifier between sense amplifier and common data line, the method comprising preventing the first enable signal to enable the sense amplifier from being enabled at an enabling interval of the second enable signal where output data of the data register is output to the common data line; and preventing the second enable signal from being enabled at an enabling interval of the first enable signal, thereby refraining overlapping between the enabling interval of the first enable signal and that of the second enable signal.

In another aspect of the method, the first enable signal is disabled when sensing data appears at the data output terminals of the sense amplifier after enabling of the first enable signal, and the second enable signal is disabled when output data appears at the data output terminals of the common data line after enabling of the second enable signal.

Disclosed is a synchronous pipeline memory device, comprising a memory cell array constructed with a plurality of memory cells to store data, in which required signals are synchronously generated with an external clock signal and read operations are completed by a plurality of cycles before data is output through an output driver after input of an address; a clock buffer for generating the first, second, third clocks in receipt with an external clock signal; an input buffer for receiving the external address in response to the first clock; a decoder for decoding an address output from the input buffer and outputting a row selection signal and a column selection signal to the memory cell array; a block sense amplifier for sensing and amplifying data of a memory cell selected by the decoder in response to a sense amplifier enabling signal shifted during the first clock cycle of the external clock; a first data register for latching the output data of the block sense amplifier and outputting the latched output data in response to the second clock shifted during the second clock cycle followed by the first clock cycle; a second data register with an output buffer inserted for latching the data output from the first data register and for outputting the latched data in response to the third clock shifted during the third clock cycle followed by the second clock cycle; an output driver for outputting outside the data output from the second data register; and a monitoring part for monitoring the sense amplifier enabling signal and the second clock signal and respectively shifting them to the block sense amplifier and the first data register, to prevent overlapping between an enabling interval of the sense amplifier enabling signal and that of the second clock.

In another aspect of the invention, the first disabling circuit is additionally connected to the monitoring part for disabling the first enable signal in response to sensing data that appears at the data output terminals of the sense amplifier after the first enable signal is enabled.

In another aspect of the invention, the second disabling circuit is additionally connected to the monitoring part for disabling the second clock signal in response to output data that appears at data output terminals of the common data line after the second clock signal is enabled.

Disclosed is a semiconductor memory device comprising a pipeline structure; a sense amplifier responsive to a first enable signal; a data register responsive to a second enable signal for latching an output of said sense amplifier between said sense amplifier and a common data line; and a monitoring part to monitor said first and second enable signals and adapted to prevent overlapping between an enabling interval of said first enable signal and said second enable signal.

DETAILED DESCRIPTION OF THE PREFERRED EMBODIMENTS

A description will first be made of a representative example of a conventional synchronous pipeline memory device having a 4(+)-stage pipeline operation (the term "N(+)-stage" meaning N or more stages) without any other intention but to allow a thorough understanding of the invention to be described in detail thereafter.

Conventional Synchronous Pipeline Memory

Figure 1:
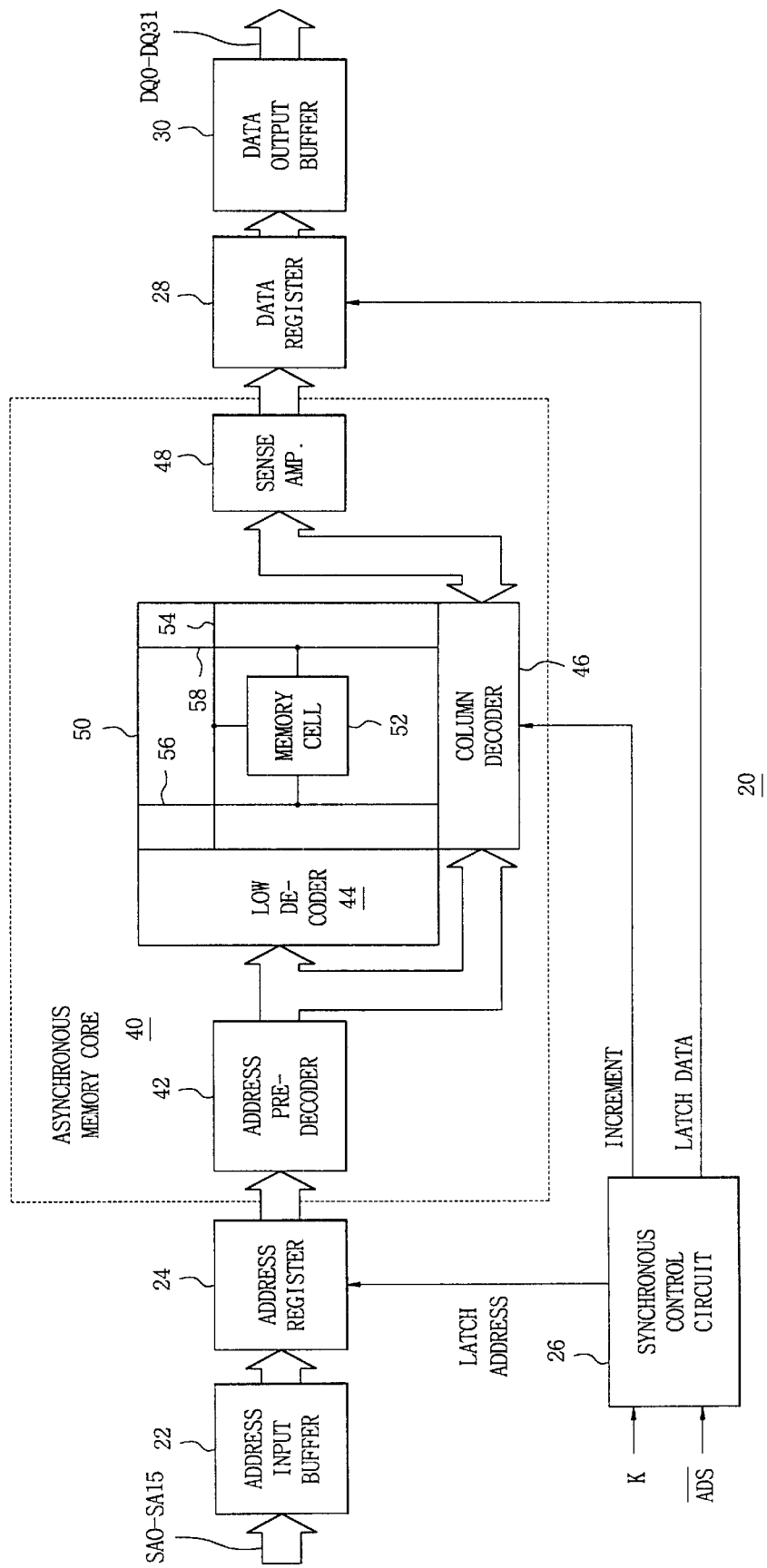
FIGS. 1 and 2 are a block diagram and the related timing diagram of a synchronous semiconductor memory device in accordance with the prior art.
Figure 2:
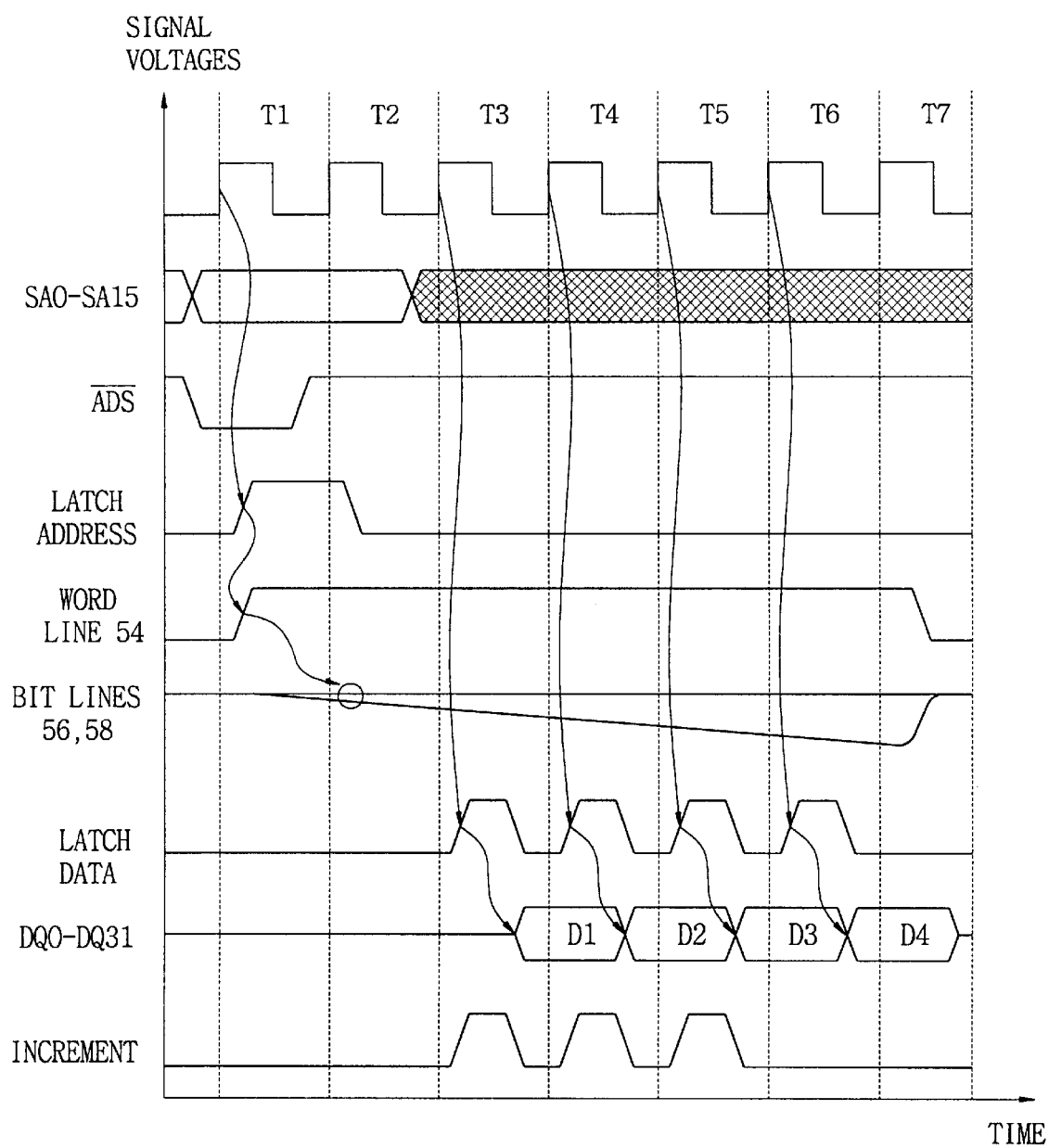
Figure 4:
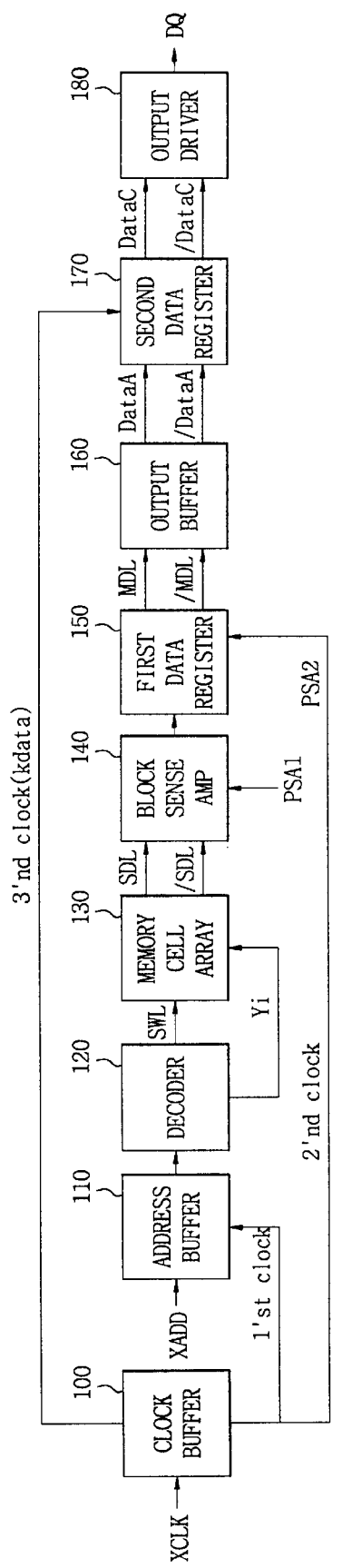
FIG. 4 is a block diagram for illustrating read operation relating part of a synchronous semiconductor memory device.

FIG. 4 also shows a conventional synchronous 4(+)-stage pipeline memory device, analogous to the 2-stage device of FIG. 1. In FIG. 4 the read operation relating part is constructed with clock buffer 100, address buffer 110, decoder 120, memory cell array 130, block sense amplifier 140, the first data register 150, output buffer 160, the second data register 170 and output driver 180. The clock buffer 100 receives an external clock signal XCLK to generate the first, second and third clock signals ($1^{st}$ clock, $2^{nd}$ clock, $3^{rd}$ clock). The address buffer 110 receives and buffers an external address XADD in response to the first clock signal and outputs it. The decoder 120 decodes a row and column address output from the address buffer 110 to output a row-selecting signal SWL and a column-selecting signal Yi. The memory cell array 130 is constructed with a plurality of memory cells positioned at the intersection of pairs of word lines and bit lines, sharing charge stored at the memory cell selected by the enabled row-selecting signal SWL and column-selecting signal Yi with the corresponding data lines SDL, /SDL. In response to a first enabling signal PSA1 (shifted during the first clock cycle of the external clock signal XCLK) the block sense amplifier 140 senses and amplifies a difference in the voltage level developed in the data lines and outputs the information as cell data. The first data register 150 latches the cell data output from the block sense amplifier 140 and outputs the latched cell data to main data lines MDL, /MDL in response to the second clock signal, $2^{nd}$ clock, which is shifted as needed to create a second enabling signal PSA2. The shifts from the clock signal to create the PSA signals are seen in FIG. 5.

Referring again to FIG. 4, the output buffer 160 connected to the main data lines MDL, /MDL buffers the output level of the cell data to output to an output terminals DataA, /DataA. The second data register 170 latches data of the output terminals DataA, /DataA and outputs the latched data to a data output terminals DataC, /DataC in response to the third clock shifted during the third clock cycle followed by the second clock cycle. The output driver 180 connected to the output terminals DataC, /DataC of the second data register 170 outputs the data output from the second data register 170 as a read output data DQ. The memory cell array 130 is usually a set of memory arrays divided into a plurality of sub-blocks, not a single array.

As shown in the drawing, the first data register 150 is installed between a rear stage of the block sense amplifier 140 and the main data lines MDL, /MDL for the 3-stage pipeline operation. In conclusion, a special feature of the structure shown in FIG. 4 is addition of a data register between the block sense amplifier 140 and the main data lines MDL, /MDL, a common data line on top of the conventional structure of the 2-stage pipeline. In other words, 1-stage pipeline is added to the structure of a 2(+)-stage pipeline. Thus, output data of the block sense amplifier is latched to the first data register 150 connected to the front stage of the output buffer 160 during the first clock cycle of an external clock, and the latched data is then latched to the second data register 170 connected to the rear stage of the output buffer 160 during the second clock cycle. Also, the data latched to the second data register is to be output outside through the output driver 180 during the third clock cycle.

Figure 5:
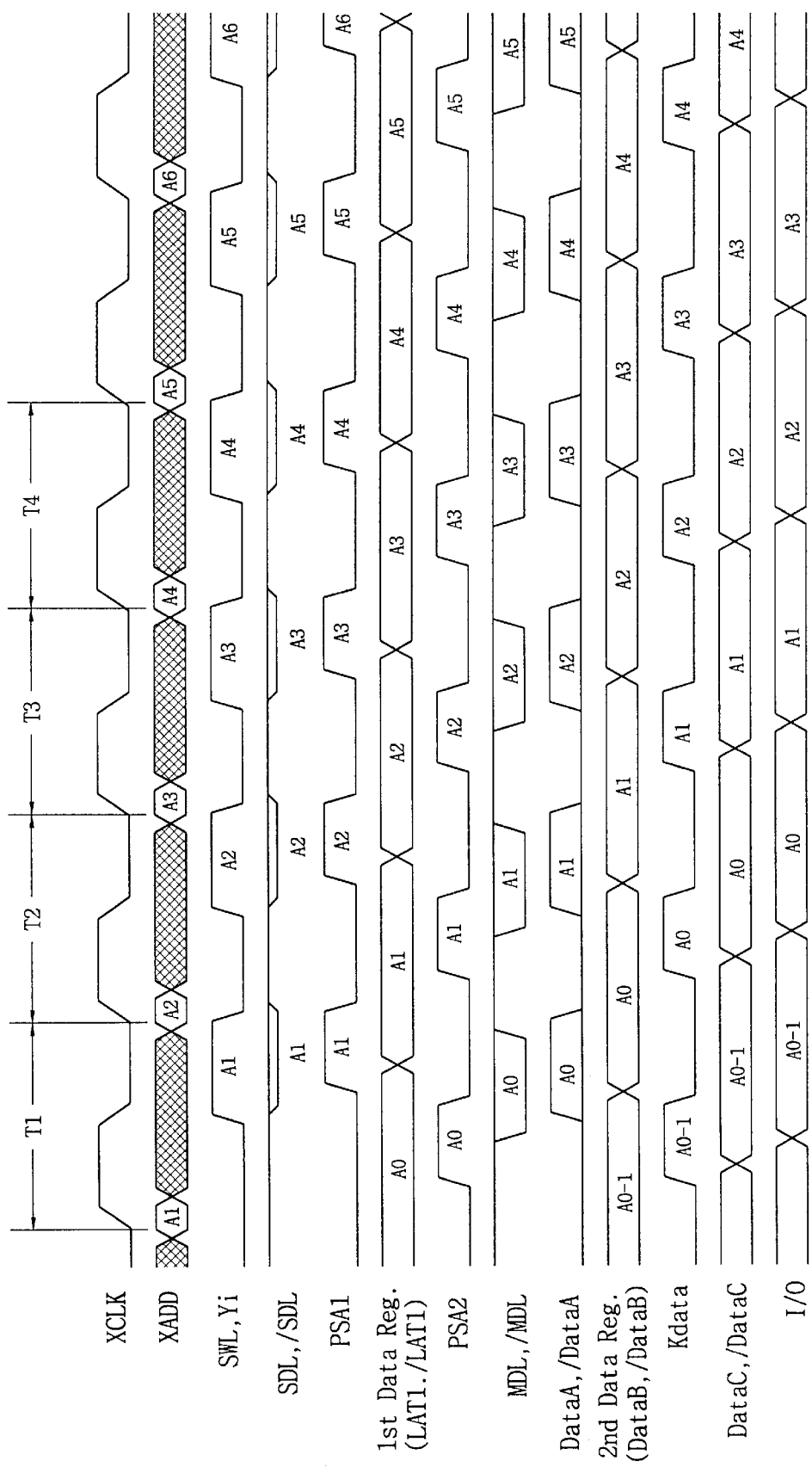
FIG. 5 is a timing diagram for illustrating data read operation in accordance with FIG. 4.

FIG. 5 is a timing diagram of the data read operations of FIG. 4. The horizontal axis indicates time, and the vertical axis indicates the level of voltage of various signals. An external address XADD labeled with symbol A1 is shifted during the first clock cycle T1 of an external clock signal XCLK, a row-selecting signal SWL and a column-selecting signal YI are output from the row and column decoder during the first clock cycle T1. The row-selecting signal SWL and column-selecting signal Yi are enabled to select a memory cell. The charge stored at the selected memory cell is developed at the corresponding data lines SDL, /SDL. When the sense amplifier enabling signal PSA1 is supplied to the block sense amplifier 140 during the first clock cycle T1, the cell data appearing on the data lines SDL, /SDL is latched to the first data register 150. When the second clock PSA2 is shifted during the second clock cycle T2 followed by the first clock cycle, the latched cell data is output to the main data lines MDL, /MDL during the second clock cycle T2. As shown in the drawing, the data that appeared at the main data lines MDL, /MDL is delayed a little and shown at the output terminals DataA, /DataA of the output buffer 160. Data of the output terminals DataA, /DataA is latched to the second data register 170, and the latched data appears at the output terminals DataC, /DataC of the second data register 170 by the third clock Kdata shifted during the third clock cycle T3 followed by the second clock cycle. Read output data DQ is pipeline-output by the output driver 180 connected to the input /output terminals DataC, /DataC through an input /output terminal I/O from the third clock cycle T3.

Figure 3:
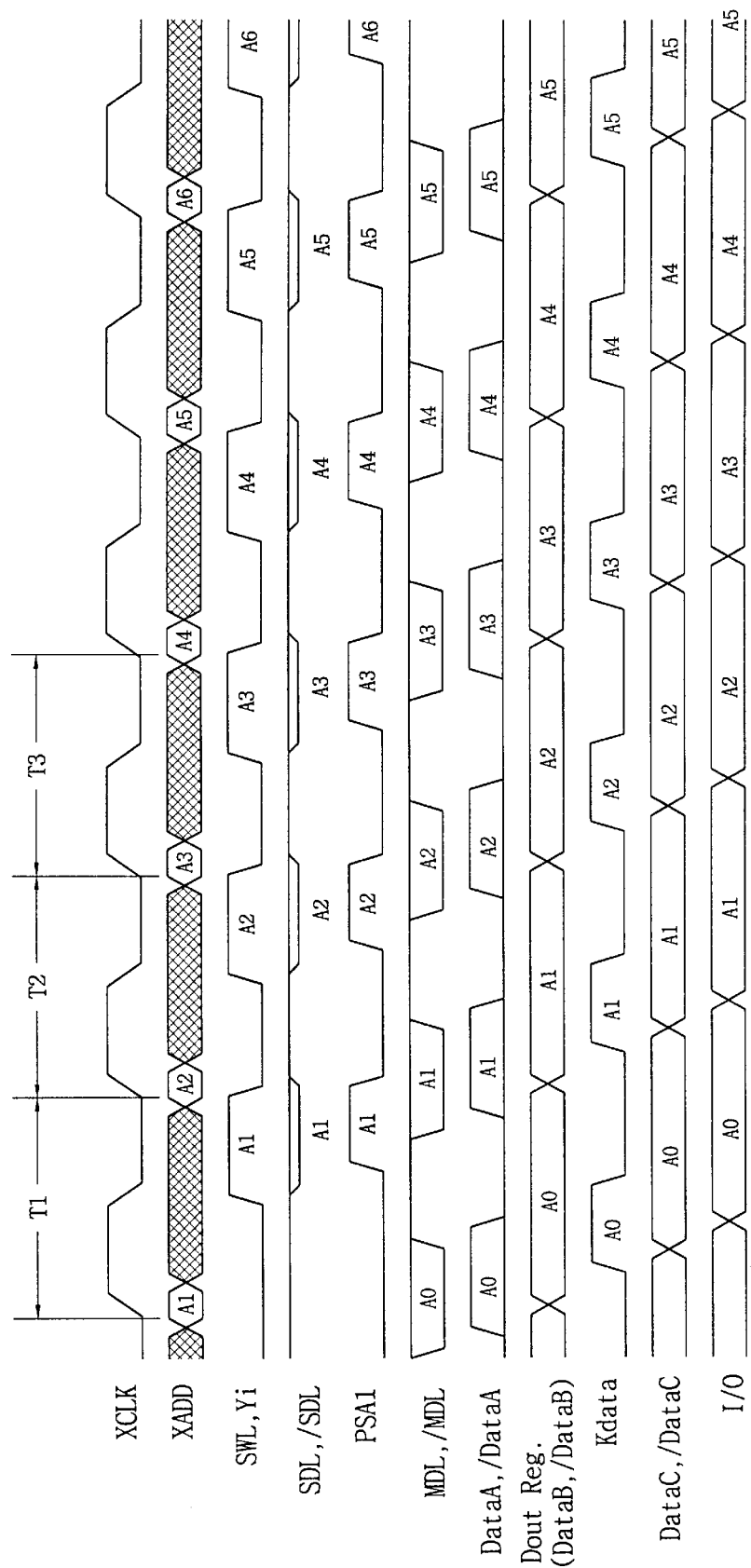
FIG. 3 is a timing diagram for illustrating read operation of a conventional 2-stage synchronous pipeline memory device.

With reference to the timing view that illustrates the conventional read operation in FIG. 5, the cycle time tCYC is different from that of the 2-stage pipeline. In FIG. 3 the cycle time tCYC is the time required for output data of the block sense amplifier 140 to be latched to the data register at the rear stage of the output buffer (the second data register 170 in FIG. 4) after shifting of an external clock signal XCLK. However, as shown in FIG. 5, the cycle time is the time required for data to be latched to the first data register 150 after shifting of an external clock signal XCLK. As a result, there is a significant reduction in the cycle time in comparison with that of the prior art. More specifically, addition of a 1-stage pipeline to the conventional pipeline structure results in a reduction in the cycle time by the time that takes for data output from the sense amplifier to reach the main data lines MDL, /MDL in addition to the time that takes for the data to reach the second data register 170 through the output buffer 160 from the main data lines MDL, /MDL.

Figure 6:
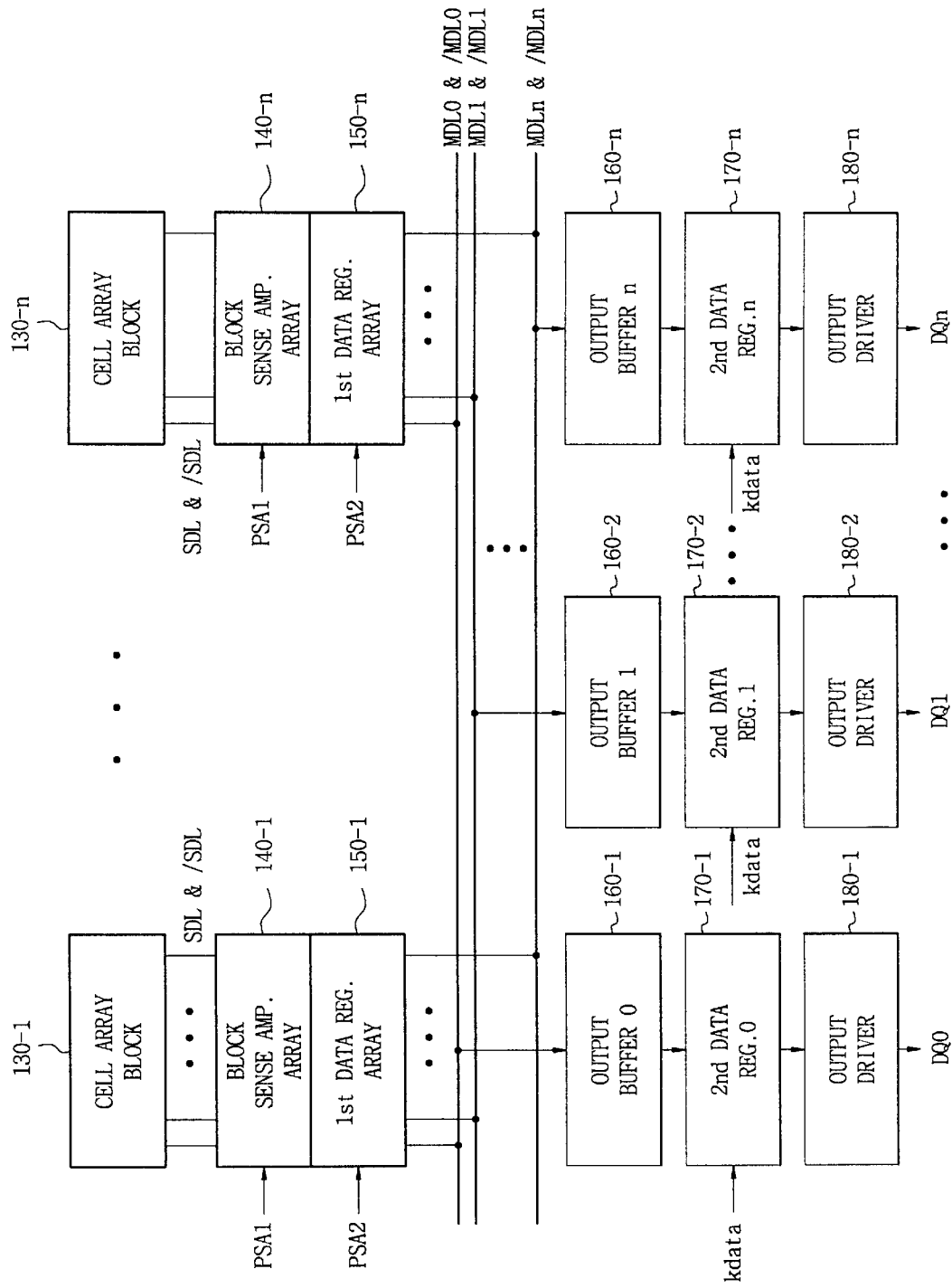
FIG. 6 is a perspective block diagram for illustrating a part of FIG. 4.

FIG. 6 is a perspective view for illustrating a part of FIG. 4. In order to provide thorough understanding about the read-pass operation, FIG. 6 illustrates blocks sequentially connected from memory cell array 130 to the output driver 180. In case that the memory cell array 130 is constructed with a plurality of cell array blocks 130-1, ..., 130-n, the block sense amplifier 140 is correspondingly constructed with a plurality of block sense amplifier arrays 140-1, ..., 140-n. The first data register is also correspondingly constructed with a plurality of data register arrays 150-1, ..., 150-n. At this time, it should be noted that the first data register arrays 150-1, ..., 150-n are positioned at the front stage of the main data lines MDL, /MDL having all the main data lines MDL0 & /MDL0, MDL1 & /MDL 1, ..., MDLn & /MDLn.

The output buffer 160 having a plurality of output buffers 160-1, ..., 160-n is correspondingly connected with the main data bus MDL, /MDL having main data lines MDL0 & /MDL0, MDL1 & /MDL1, ..., MDLn & /MDLn. The second data register 170 connected to the front stage of the output driver 180 having a plurality of output drivers 180-1, ..., 180-n is constructed a plurality of the second data register arrays 170-1, ..., 170-n.

In FIG. 6 shows an expanded view of how the memory cell arrays and other components of FIG. 4 are related to the main data lines MDL0 & /MDL0 through MDLn & /MDLn. A plurality of first data register arrays 150-1, ..., 150-n respond to the second enabling signal PSA2 and a plurality of the second data registers 170-1, ..., 170-n respond to the third clock signal Kdata, created from a shift of the third clock cycle T3.

Figure 7:
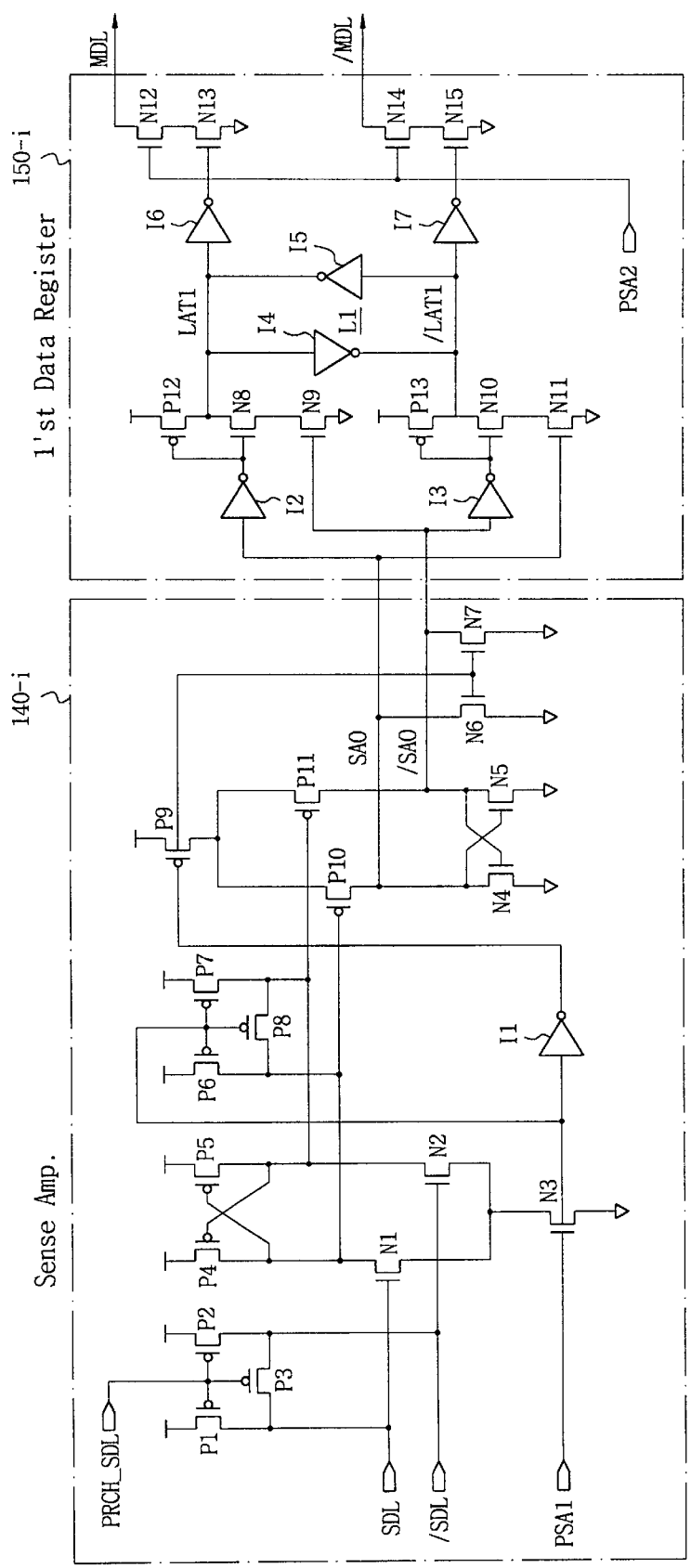
FIG. 7 is a perspective circuit diagram for illustrating a block sense amplifier and the first data register shown in FIGS. 4 and 6.

FIG. 7 is a detailed embodiment of the block sense amplifier 140-i and the first data register 150-i of FIGS. 4 and 6. In this embodiment, the block sense amplifier 140-i is constructed with p-channel MOS (hereinafter referred to as PMOS) transistors P1, P2, P3, P4, P5, P6, P7, P8, P9, P10, and P1; n-channel MOS (hereinafter referred to as NMOS) transistors N1, N2, N3, N4, N5, N6, and N7; and a CMOS inverter 11. The PMOS transistors P1, P2, P3 are adapted to receive a precharge signal PRCH_SDL that effects precharging of the data lines SDL, /SDL. The NMOS transistors N1, N2 have their drain terminals respectively connected to the cross-coupled PMOS transistors P4, P5, their gates to the data lines SDL, /SDL, and their sources to the drain of NMOS transistor N3. N3 responds to sense amplifier enabling signal PSA1, thereby activating N1 and N2 to respond to SDL and /SDL. The PMOS transistors P6, P7, P8 receive the enabling signal PSA1 from the N3 gate terminal, their function being to precharge the output terminals of the first sense amplifier during inactivation of the first sense amplifier. The PMOS transistors P9, P10, P11 and NMOS transistors N4, N5 play a role as a secondary sense amplifier that secondarily amplifies an output of the first sense amplifier. The PMOS transistor P9 of the secondary sense amplifier receives the sense amplifier enabling signal PSA1 through the inverter 11. The NMOS transistors N6, N7, having drain terminals respectively connected to output terminals SA0, /SA0 of the second sense amplifier, function to ground the output terminals SA0, /SA0 when the first enabling signal PSA1 indicates non-enablement.

The first data register 150-i is constructed with inverters I2, I3, I4, I5, I6, and I7; PMOS transistors P12 and P13; and NMOS transistors N8, N9, N10, N11, N12, N13, N14 and N15. Note that the input terminals of 14 and 15 are connected with each other's output terminals so as to create an inverter latch L1 with latch terminals LAT1 and /LAT1. The inverter 12 and transistors P12, N8, N9 function as a self-latching driving circuit in which data appearing at the output terminal SA0 of the second sense amplifier 140-i is self-latched to latch terminal LAT1. Similarly, the inverter I3 and transistors P13, N10, N11 function as a self-latching driving circuit in which complementary data appearing at the output terminal /SA0 of the second sense amplifier 140-i is self-latched to complementary latch terminal /LAT1. The gate of transistor N12 receives the second enabling signal PSA2, the drain is connected to the main data line MDL, and the source is connected to the drain of NMOS transistor N13. The gate of N13 is connected to the output of the inverter 16 and functions as an intermediary driving circuit that transmits the latched data to the rear stage in response to the second enabling signal PSA2. Similarly, the NMOS transistors N14, N15 also function as an intermediary driving circuit, but with complementary data. The main data lines MDL, /MDL will generally be precharged at a high level of voltage, for instance, supply voltage, before the second clock PSA2 is enabled to its high level.

Figure 8:
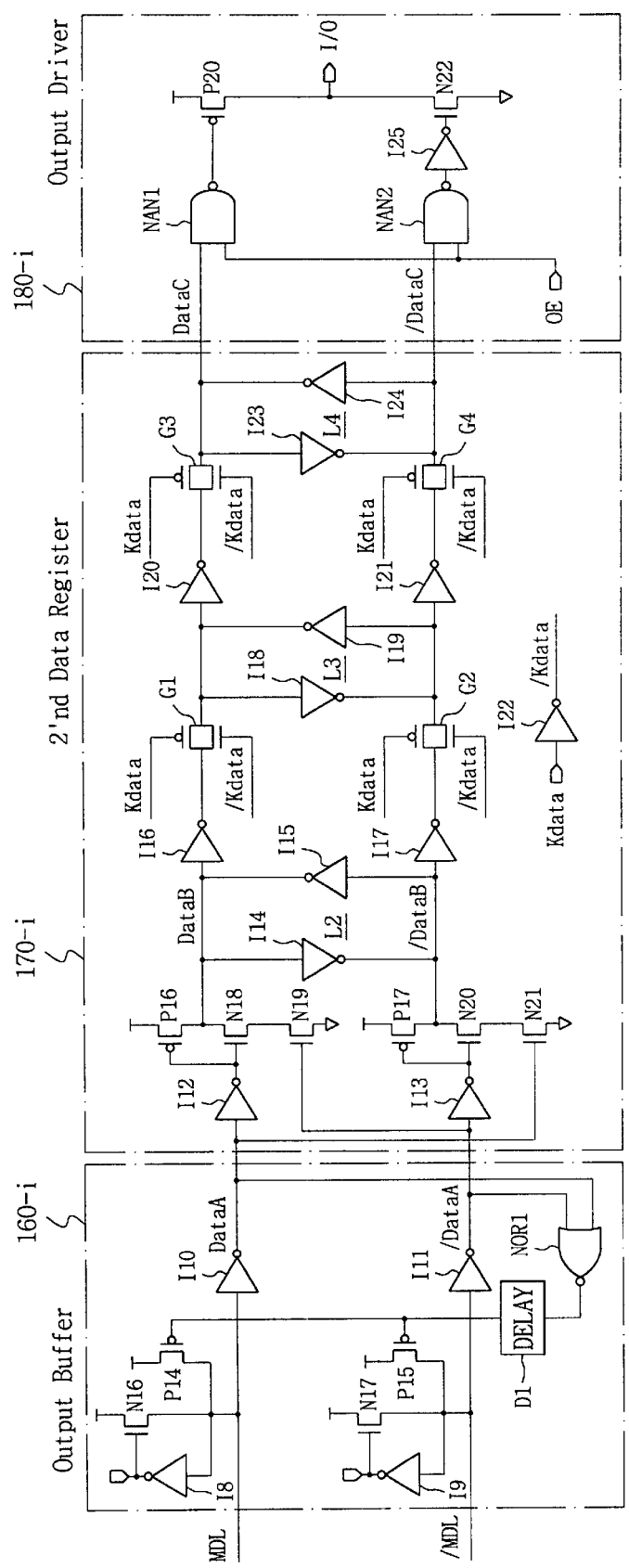
FIG. 8 is a perspective circuit diagram for illustrating a data output buffer, the second register and an output driver shown in FIGS. 4 and 6.

FIG. 8 shows detailed embodiments of the output buffer 160-i, second data register 170-I, and output driver 180-i of FIGS. 4 and 6. As shown in FIG. 8, the output buffer 160-i for buffering and outputting the shifted data is constructed with inverters I8, I9, I10, and I11; PMOS transistors P14 and P15; NMOS transistors N16 and N17; a delay unit D1; and an NOR gate NOR1. Inverter 18 and transistors N16 and P14 function to precharge the main data line MDL to its high level of voltage in response to an output of the NOR gate NOR1 shifted through the delay unit D1. Similarly, inverter I9 and transistors N17 and P15 function to precharge the complementary main data line /MDL to its high level of voltage in response to an output of the NOR gate NOR1 shifted through the delay unit D1.

The embodiment of the second data register 170-I, connected to output terminals DataA, /DataA of the output buffer 160-I, comprises inverter latches L2, L3 and L4; inverters I12 and I13, functioning as a self-latching driving circuit; PMOS and NMOS transistors P16, P17, N18, N19, N20, and N21; and the first and second transmission gates G1, G2, G3, and G4. The third clock signal Kdata and its complementary third clock signal /Kdata shifted during the third clock cycle T3 followed by the second clock cycle T2 are shifted by pass signals of the first and second transmission gates G1, G2, G3, and G4.

The output driver 180-i is connected to the output terminals DataC, /DataC of the second data register 170-I. The embodiment shown comprises NAND gates NAN1 and NAN2, adapted to receive the outputs of terminals DataC and /DataC and to receive a common output enable signal OE; an inverter 125 connected to the output terminal of NAN2; a driving PMOS transistor P20 having a gate terminal connected to receive the output of NAN1, with its source connected to the supply voltage and its drain to the I/O output; and the driving transistor N22 having its gate connected to the output of 125, its drain to the I/O output and its source to ground.

The circuits shown in FIGS. 7 and 8 are typical embodiments of the art, allowing for a variety of modifications in practice. Hereinafter, with reference to FIGS. 7 and 8, a further detailed description will be made on a data passing flow during the 3-stage pipeline read operation. Note that the following description of the 3-stage pipeline operation is with reference to the timing view shown in FIG. 5.

In FIG. 7, the sense amplifier enabling signal PSA1 is logical high for read operations, thereby activating transistor N3 and shutting off transistors N6 and N7. Transistors NI, N2 then turn on to allow the first sense amplifier, comprising transistors P4, P5, N1, and N2, to perform its sensing and amplifying function. The voltage difference between data lines SDL and /SDL is thereby amplified. When the sense amplifier enabling signal PSA1 is high, the inverter I1 output goes low, causing transistor P9 to turn on, thereby activating the second sense amplifier comprising transistors P9, P10, P11, N4, and N5.

The amplifier works as follows: a charge stored at a selected memory cell is shared with corresponding data lines SDL and its complement /SDL, but leakage causes SDL and /SDL to drift toward one another. For example, SDL could be high while /SDL is low, but leakage reduces the voltage difference, though not enough to fail to meet the threshold requirements of a transistor gate. When PSA1 goes high, transistor N1 is activated, thereby causing P5 to activate. N2 is shut off, so the source of P5 goes full high to the supply voltage. Because the source of P5 is high, P4 is shut off and its source is grounded to logical low by N1 (Note, we assume for illustration that ground is logical low and the supply voltage is logical high. This need not be the case). A similar amplifying operation occurs at the second sense amplifier comprising transistors P9, P10, P11, N4, and N5, so as to deliver a clean signal at SA0 and /SA0.

Continuing with this example to the data register 150-I, the high and low logic levels appearing at the output terminals SA0, /SAO are self-latched to an inverter latch L1. The logical high appearing at the output terminal SA0 is inverted to logical low by the inverter I2 to turn on transistor P12 and turn off transistor N8. Transistor N9 receives a low voltage from the output terminal /SA0 and turns off, resulting in latch terminal LATI going high. Conversely, transistor N10 receives a high voltage through inverter I3 and turns on, while transistor P3 shuts down. N11 is activated by the high voltage of SAO, so latch terminal /LAT1 is thereby grounded through the N10, N11 combination. The high and low levels appearing at the latch terminal LAT1 and the complementary latch terminal /LAT1 are latched by the inverter latch constructed with inverters 14, 15, so as to maintain the latched data even when PSAl goes logical low again and SAO and /SAO are thereby grounded by transistors N6 and N7. The outputs of the inverter latch LAT1 and /LAT1 are inverted by inverters 16, 17 into low and high levels. The NMOS transistors N12, N14 of the intermediary driving circuit receive the second clock signal PSA2. The main data lines MDL, /MDL are already precharged to logical high, so all that is required is that one of the main data lines be grounded. In our example, /LAT1 is low, so transistor N15 is activated. When PSA2 goes high, N14 is also activated, thereby grounding /MDL. At last, the high and low levels latched at the latch terminal LAT1 and the complementary latch terminal /LAT1 by the intermediary driving circuit are synchronously transmitted by the second clock PSA2 shifted to the output buffer 160-i positioned at the rear stage at the second cycle of the external clock signal.

Buffered low and high levels appear as output data at the output terminal DataA, /DataA of the output buffer 160-i shown in FIG. 8. The low and high levels are self-latched to the latch terminal DataB and complementary latch terminal /DataB of the first inverter latch L2 of the second data register 170-i. The low and high levels are respectively inverted into high and low levels and applied to the input terminals of the corresponding first gate transmission gates G1 and G2, which pass on the voltage levels for latching in the second inverter latch L3. The L3 voltages are then inverted through inverters I20 and I21 and applied to the second transmission gates G3 and G4, which transmit the voltage levels in accordance with the third clock signal Kdata and its complement /Kdata. The outputs of the second transmission gates G3, G4 are latched to the third inverter latch L4 to thereby appear at the output terminals DataC, /DataC of the second data register 170-i.

The NAND gates NAN1 and NAN2 of the output driver 180-i receive the output of terminals DataC, /DataC from the second data register 170-I, and also receive a common output enable signal OE. If MDL was high, then DataC is low. Given a high OE signal, transistor P20 is activated and N22 shut off and the output goes high. Conversely, a low voltage MDL would result in a low I/O output.

An additional data register is included between block sense amplifier for amplifying cell data and the common data line MDL, /MDL, that is, an addition of one-stage pipeline to perform 3-stage pipeline operation, thereby making it possible to make a great reduction in the cycle time in accordance with the prior art. A 2-stage pipeline method applied to a 4 megabyte synchronous pipeline SRAM typically results in a cycle time tCYC of 1/(275MHz)=3.6 ns per cycle. If a 3-stage pipeline method is applied, the cycle time tCYC is 1/(400MHz)=2.5 ns per cycle. As a result, the cycle time gets shorter by approximately 1.1 ns when a stage is added. It is therefore desirable to add further stages to reduce the cycle time still further.

The Invention

A detailed description having been made on the structure and operation of a conventional synchronous pipeline semiconductor memory device, the invention will now be described with respect to synchronous pipeline memory devices having four or more stages, so as to substantially reduce cycle time tCYC.

Figure 9:
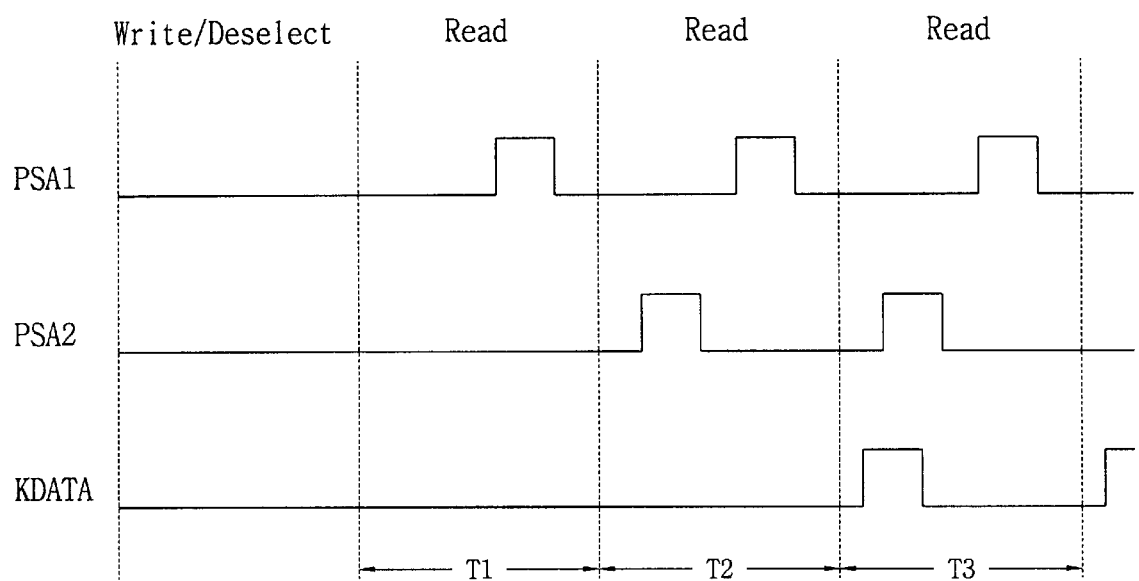
FIGS. 9 and 10 illustrate the relationship in timings of signals at a long cycle and at a short cycle in a 3-stage pipeline operation.
Figure 10:
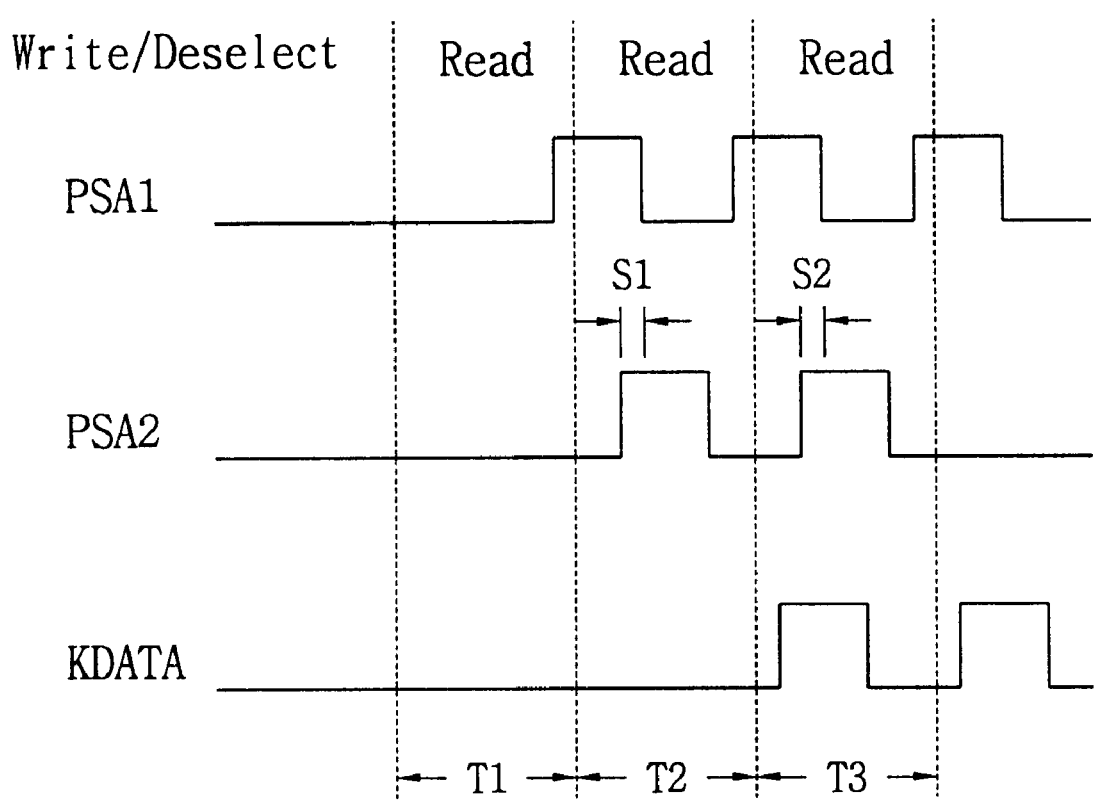

Referring to FIGS. 9 and 10, substantial reductions in the cycle time may result in overlapping intervals S1, S2 (in FIG. 10) even in 3-stage pipelines. FIGS. 9 and 10 illustrate the relationship in timings of signals in the long and short cycles of the 3-stage pipeline device. As shown in FIGS. 9 and 10, the signals PSA1, PSA2, KDATA are, respectively, a sense amplifier enabling signal to be enabled during the first cycle of an external clock signal, the second clock signal for controlling the first register to be enabled during the second cycle, and the third clock signal for controlling the second register to be enabled during the third cycle. Overlapping intervals S1, S2 will result in data read errors.

Further reductions in cycle time that are obtained by upgrading to 4(+)-stage pipeline operation will exacerbate the overlap problem. Therefore, there is disclosed herein a synchronous pipeline semiconductor memory device and a method for operating same that avoids overlapping intervals despite reductions in cycle time that is highly advantageous in 4(+)-stage pipeline devices.

Figure 11:
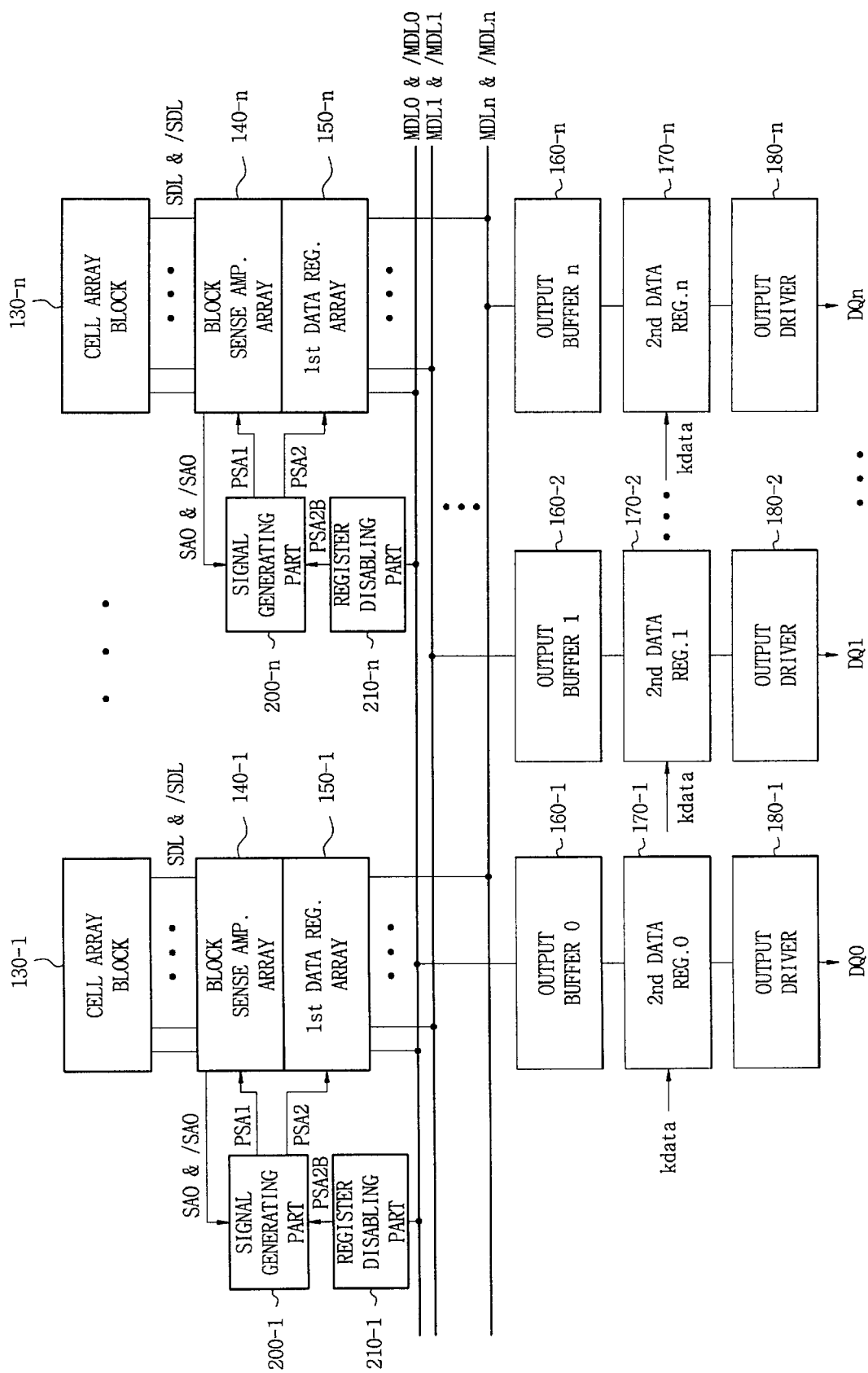
FIG. 11 is a block diagram for illustrating a read operation relating part of a synchronous semiconductor memory device in accordance with an embodiment of the present invention.

Referring to FIG. 11, there is shown a block diagram of a synchronous semiconductor memory device in accordance with an embodiment of the present invention. As shown in FIG. 11, in addition to the block structure shown in FIG. 6, there are also included a plurality of signal-generating parts 200-1, . . . , 200-n and register-disabling parts 210-1, . . . , 210-n. The structure of a signal-generating part 200-i and register-disabling part 210-i are shown in detail in FIG. 12.

Figure 12:
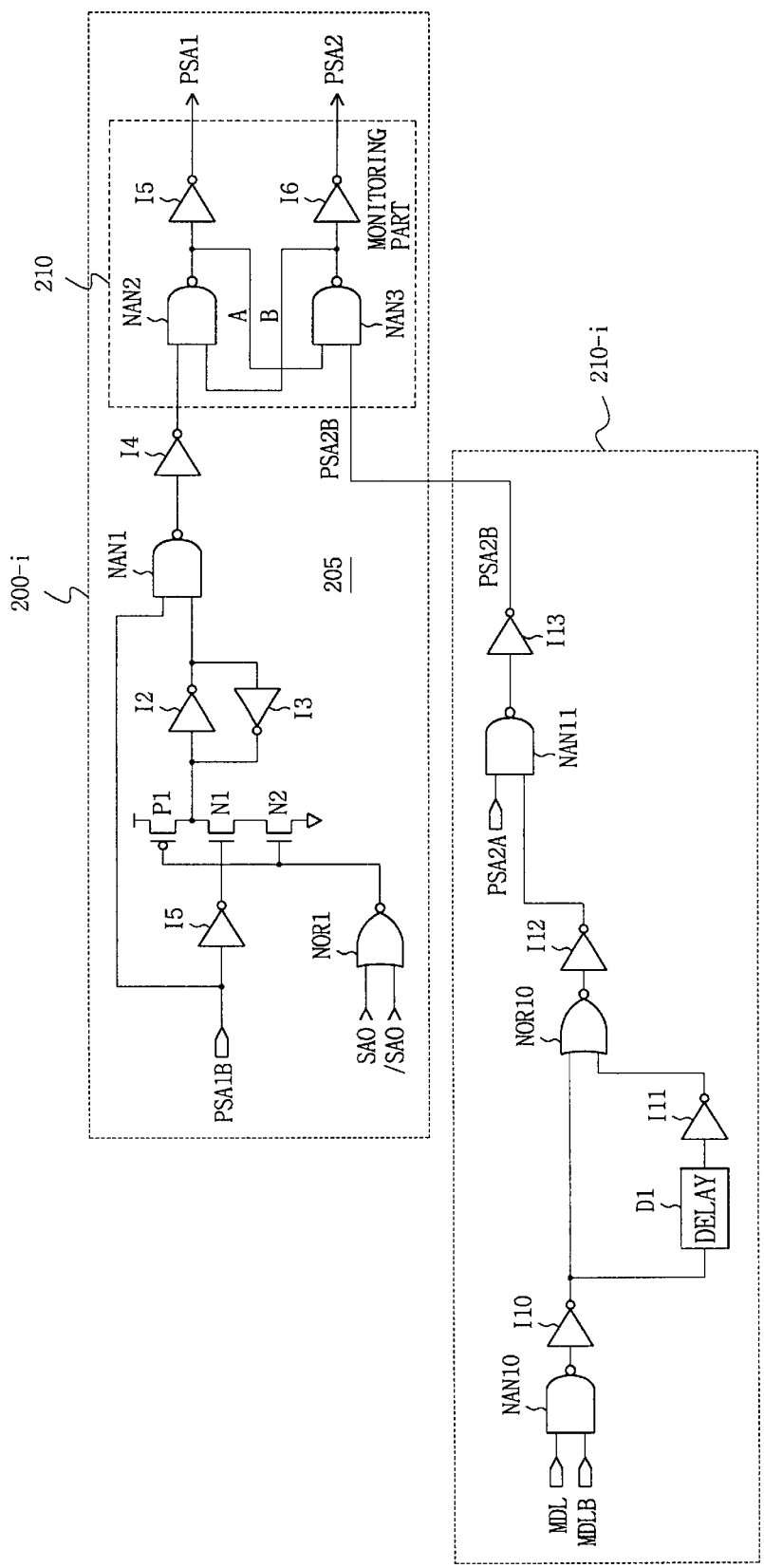
FIG. 12 is a perspective circuit diagram for illustrating a signal-generating part and a register-disabling part shown in FIG. 11.

Referring to FIG. 12, there is shown a schematic diagram of an embodiment of a signal-generating part 200-i and a register-disabling parts 210-i. With reference to FIGS. 11 and 12, the signal-generating parts 200-i comprises a first disabling circuit 205 and a monitoring part 210. The register-disabling parts 210-i functions as a second disabling circuit. The monitoring part 210 monitors first and second enable signals PSA1 and PSA2 to prevent overlapping. In the embodiment shown, the monitoring part 210 comprises a flip-flop circuit having NAND gates NAN2, NAN3 and driving inverters I5, I6. This hardware configuration ensures that the intervals for the first and second enable signals PSA1, PSA2 cannot overlap one another. The first disabling circuit 205 connected to the pre-stage of the monitoring part 210 of the signal-generating part 200-i functions to disable the first enable signal in response to sensing data that appears at data output terminals SA0, /SA0 of the sense amplifier 140-1 after enabling of the first enable signal PSA1.

The embodiment shown for the first disabling circuit 205 comprises an inverter 15 that inverts a primary sense amplifier enabling signal PSA1B that is directly shifted to the block sense amplifier 140 in FIG. 4; a NOR gate NOR 1 for NOR-gating the sensing data of the data output terminals SA0, /SA0; PMOS and NMOS transistors P1, N1, and N2, where channels for supply voltage and ground are connected in series; inverters I2, I3 forming an inverter latch; a NAND gate NAN1 for NAND-gating the output of the inverter latch and the primary sense amplifier enabling signal PSA1B; and an inverter 14 for inverting the output of the NAND gate NAN1. The register-disabling part 210-i connected to the pre-stage of the monitoring part 210, that is, the second disabling circuit 210-i functions to disable the second enable signal PSA2 in response to output data that appears at the data output terminals MDL, /MDL of the common data line after enabling of the second enable signal PSA2. In the embodiment shown, the second disabling circuit 210-i comprises a NAND gate NAN10 for NAND-gating the output data that appears at the data output terminals MDL, /MDL of the common data line; an inverter I10 for inverting the output of the NAND gate NAN10; a time delay D1 for delaying the output of the inverter I10 for a predetermined period of time; an inverter I11 for inverting the output of the time delay D1; a NOR gate NOR10 for NOR-gating the outputs of the inverters I10 and I11; an inverter I12 for inverting the output of the NOR gate NOR10; a NAND gate NAN 11 for NAND-gating the logic of the second (primary) clock signal PSA2 that has been directly shifted to the first data register 150 in FIG. 4; and an inverter I13 for inverting the output of the NAND gate NAN11.

Noted that the first enable signals PSA1, PSA2 generated by the monitoring part 210 of FIG. 12 and applied to the block sense amplifier 140-1 and first data register 150-1 are waveform calibrated enable signals, unlike the first and second enable signals PSA1, PSA2 described with respect to FIG. 6. Instead, the first and second enable signals PSA1, PSA2 from FIG. 6 correspond to PSA1B and PSA2A, respectively.

If the sense amplifier enabling signal PSA1 is enabled by the function of the monitoring part 210 in FIG. 12, the second clock signal PSA2 for controlling the register is prevented from being enabled. If the second clock PSA2 for controlling the register is enabled, the sense amplifier enabling signal PSA1 is prevented from being enabled. More specifically, if the output signal PSA2B of the second disabling circuit 210-i is low and the primary sense amplifier enabling signal PSA1B goes high, the first enable signal PSA1 is enabled high. Even if the output signal PSA2B then goes high, the second enable signal PSA2 cannot go high so long as PSA1 is high. Only after the first enable signal PSA1 goes low will the second enable signal PSA2 be permitted to go high. In the opposite case, the first enable signal PSA1 cannot also be enabled to its high level during the interval where the second enable signal PSA2 is enabled to its high level.

If the pulse width of the first enable signal PSA1 is very wide, there can be a limitation to high-speed operation. In other words, because the second enable signal PSA2 cannot be enabled during the interval where the signal PSA1 is enabled, there will be a delay in latching to the first register if PSA1 stays high too long. In order to minimize the pulse width of the first enable signal PSA1, the sensing data that appears at the data output terminals SA0, /SA0 of the sense amplifier is tracked to determine its disabling operation in the present invention. In other words, if the signal PSA1B is enabled, the first enable signal PSA1 is enabled to show data sensed and amplified at the data output terminals SA0, /SA0 of the sense amplifier. In order to make the pulse width of the first enable signal PSA1 small, the data that appears at the data output terminals SA0, /SA0 of the sense amplifier is NOR gated by the NOR gate NOR1, shifted to the PMOS and NMOS transistors P1, N1, N2 and provided as an input of the NAND gate NAN1 through the inverters I2, I3 of an inverter latch, so as to swiftly disable the PSA1 signal. In consequence, the PSA1 signal is allowed to remain high only long enough to serve its latching function.

Analogously, if the pulse width of the second enable signal PSA2 is too large, there may also be a limitation in cycle time. Therefore, in the embodiment shown in FIG. 12, data that appears at the data output terminals MDL, /MDL of the common data line is tracked in order to minimize the pulse width of the second enable signal PSA2. Main data lines MDL, /MDL are NAND gated by the NAND gate NAN11, and the resultant output is logically combined. Then, the result is provided as an input of the NAND gate NAN11 to swiftly determine disable the PSA2 signal upon latching.

The detailed structure of FIG. 12, in spite of a reduction made in cycle time, results in no occurrence of an overlapping interval shown in the timing diagram of FIG. 10 when the first and second enable signals are enabled, thereby avoiding data error. Thus, there will be no longer a problem of instability in data output at ultra high-speed operations.

While the invention has been described in terms of a single preferred embodiment, those skilled in the art will recognize that the invention can be practiced with modification within the spirit and scope of the appended claims. For instance, the detailed structure of the first disabling circuit 205 and the monitoring part 210 constructing the signal-generating part 200-i and a register-disabling part 210-i can be changed with other equivalent element or logic circuit, allowing necessary addition or subtraction.

As described above, there is an advantage in the synchronous 4(+)-stage pipeline semiconductor memory device of the present invention that prevents occurrence of overlapping intervals in which a sense amplifier enabling signal and a second clock signal for controlling a register are simultaneously enabled by a reduction in the cycle time, in that there is no longer a problem of instability in data output in the reduced cycle time.

It is to be understood that all physical quantities disclosed herein, unless explicitly indicated otherwise, are not to be construed as exactly equal to the quantity disclosed, but rather about equal to the quantity disclosed. Further, the mere absence of a qualifier such as "about" or the like, is not to be construed as an explicit indication that any such disclosed physical quantity is an exact quantity, irrespective of whether such qualifiers are used with respect to any other physical quantities disclosed herein.

While preferred embodiments have been shown and described, various modifications and substitutions may be made thereto without departing from the spirit and scope of the invention. Accordingly, it is to be understood that the present invention has been described by way of illustration only, and such illustrations and embodiments as have been disclosed herein are not to be construed as limiting to the claims.

What is claimed is:

1. A semiconductor memory device comprising:

a pipeline structure having four or more stages;

a sense amplifier responsive to a first enable signal;

a data register responsive to a second enable signal for latching an output of said sense amplifier between said sense amplifier and a common data line; and a monitoring part to monitor said first and second enable signals and adapted to prevent overlapping between an enabling interval of said first enable signal and said second enable signal.

2. The device of claim 1, wherein the monitoring part comprises a latch part constructed with logic elements.

3. The device of claim 2, wherein the latch part is a NAND gate latch comprising two NAND gates.

4. The device of claim 1, wherein the first disabling circuit is additionally connected to the monitoring part for disabling the first enable signal in response to sensing data that appears at data output terminals of the sense amplifier after the first enable signal is enabled.

5. The device of claim 1 or 4, wherein the second disabling circuit is additionally connected to the monitoring part for disabling the second enable signal in response to output data that appears at data output terminals of the common data line after the second enable signal is enabled.

6. A synchronous pipeline semiconductor memory device, comprising:

a memory cell array constructed with a plurality of memory cells;

a sense amplifier for sensing and amplifying cell data of a selected memory cell in response to the first enable signal shifted from the first clock cycle of an external clock;

a first data register connected between an output terminal of the sense amplifier and the common data line for outputting the output data of the sense amplifier to the common data line in response to the second enable signal shifted from the second clock cycle followed by the first clock cycle;

a second data register for receiving output data of an output buffer connected to the common data line and providing the output data to an output driver in response to the third enable signal shifted from the third clock cycle followed by the second clock cycle; and a monitoring part for monitoring the first and second enable signals and then respectively shifting the calibrated first and second enable signals to the sense amplifier and the first data register, to prevent overlapping between enabling intervals of the first and second enable signals when the first and second enable signals are respectively enabled.

7. The device of claim 6, wherein the monitoring part comprises a flip-flop circuit.

8. The device of claim 7, wherein the flip-flop circuit is a NAND gate type of a flip-flop circuit constructed with two NAND gates.

9. The device of claim 6, wherein the first disabling circuit is additionally connected to the monitoring part for disabling the first enable signal in response to sensing data that appears at the data output terminals of the sense amplifier after the first enable signal is enabled.

10. The device of claim 9, wherein the second disabling circuit is additionally connected to the monitoring part for disabling the second enable signal in response to output data that appears at data output terminals of the common data line after the second enable signal is enabled.

11. A method for controlling a sense amplifier and a data register of a semiconductor memory device having a pipeline structure of four or more stages, comprising:

providing a data register for latching an output of the sense amplifier between said sense amplifier and a common data line;

preventing the first enable signal to enable the sense amplifier from being enabled at an enabling interval of the second enable signal where output data of the data register is output to the common data line; and preventing the second enable signal from being enabled at an enabling interval of the first enable signal, thereby refraining overlapping between the enabling interval of the first enable signal and that of the second enable signal.

12. The method of claim 11, wherein the first enable signal is disabled when sensing data appears at the data output terminals of the sense amplifier after enabling of the first enable signal; and wherein the second enable signal is disabled when output data appears at the data output terminals of the common data line after enabling of the second enable signal.

13. A synchronous pipeline memory device, comprising:

a memory cell array constructed with a plurality of memory cells to store data, in which required signals are synchronously generated with an external clock signal and read operations are completed by a plurality of cycles before data is output through an output driver after input of an address;

a clock buffer for generating the first, second, third clocks in receipt with an external clock signal;

an input buffer for receiving the external address in response to the first clock;

a decoder for decoding an address output from the input buffer and outputting a row selection signal and a column selection signal to the memory cell array;

a block sense amplifier for sensing and amplifying data of a memory cell selected by the decoder in response to a sense amplifier enabling signal shifted during the first clock cycle of the external clock;

a first data register for latching the output data of the block sense amplifier and outputting the latched output data in response to the second clock shifted during the second clock cycle followed by the first clock cycle;

a second data register with an output buffer inserted for latching the data output from the first data register and for outputting the latched data in response to the third clock shifted during the third clock cycle followed by the second clock cycle;

an output driver for outputting outside the data output from the second data register; and a monitoring part for monitoring the sense amplifier enabling signal and the second clock signal and respectively shifting them to the block sense amplifier and the first data register, to prevent overlapping between an enabling interval of the sense amplifier enabling signal and that of the second clock.

14. The device of claim 13, wherein the first disabling circuit is additionally connected to the monitoring part for disabling the first enable signal in response to sensing data that appears at the data output terminals of the sense amplifier after the first enable signal is enabled.

15. The device of claim 13, wherein the second disabling circuit is additionally connected to the monitoring part for disabling the second clock signal in response to output data that appears at data output terminals of the common data line after the second clock signal is enabled.

16. The device of claim 14, wherein the second disabling circuit is additionally connected to the monitoring part for disabling the second clock signal in response to output data that appears at data output terminals of the common data line after the second clock signal is enabled.

17. A semiconductor memory device comprising:

a pipeline structure;

a sense amplifier responsive to a first enable signal;

a data register responsive to a second enable signal for latching an output of said sense amplifier between said sense amplifier and a common data line; and a monitoring part to monitor said first and second enable signals and adapted to prevent overlapping between an enabling interval of said first enable signal and said second enable signal.

* * * * *